United States Patent
Kim et al.

(10) Patent No.: US 8,730,751 B2
(45) Date of Patent: *May 20, 2014

(54) SEMICONDUCTOR MEMORY DEVICE FOR CONTROLLING OPERATION OF DELAY-LOCKED LOOP CIRCUIT

(75) Inventors: Jun-Bae Kim, Seoul (KR); Seong-Jin Jang, Seongnam-si (KR); Young-Uk Chang, Suwon-si (KR); Sin-Ho Kim, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 12 days.

This patent is subject to a terminal disclaimer.

(21) Appl. No.: 13/467,188

(22) Filed: May 9, 2012

(65) Prior Publication Data

US 2012/0218848 A1    Aug. 30, 2012

Related U.S. Application Data

(63) Continuation of application No. 12/580,585, filed on Oct. 16, 2009, now Pat. No. 8,184,495.

(30) Foreign Application Priority Data

Oct. 16, 2008    (KR) .......................... 10-2008-0101615

(51) Int. Cl.
    *G11C 7/00*    (2006.01)
(52) U.S. Cl.
    USPC ....................... 365/222; 365/194; 365/233.11
(58) Field of Classification Search
    USPC ............ 365/194, 222, 189.07, 189.08, 233.1, 365/233.11
    See application file for complete search history.

(56) References Cited

U.S. PATENT DOCUMENTS 8,184,495 B2 *    5/2012    Kim et al. ..................... 365/222

\* cited by examiner

*Primary Examiner* — Richard Elms
*Assistant Examiner* — Hien Nguyen
(74) *Attorney, Agent, or Firm* — F. Chau & Associates, LLC

(57) ABSTRACT

A semiconductor memory device for controlling an operation of a delay-locked loop (DLL) circuit is provided. The semiconductor memory device includes a DLL circuit that receives an external clock signal and that performs a locking operation on the external clock signal and an internal clock signal, thereby obtaining a locked state. A control unit controls the DLL circuit to constantly maintain the locked state during an updating period of an auto-refresh period of an auto-refresh operation for refreshing memory banks.

16 Claims, 2 Drawing Sheets

SEMICONDUCTOR MEMORY DEVICE FOR CONTROLLING OPERATION OF DELAY-LOCKED LOOP CIRCUIT

CROSS-REFERENCE TO RELATED APPLICATION

This application is a Continuation Application of U.S. patent application Ser. No. 12/580,585 filed Oct. 16, 2009 now U.S. Pat. No. 8,184,495, which claims priority to and the benefit of Korean Patent Application No. 10-2008-0101615, filed on Oct. 16, 2008, in the Korean Intellectual Property Office, the entire contents of which are incorporated by reference herein.

BACKGROUND

The present disclosure relates to memory devices, and more particularly, to a semiconductor memory device for controlling an operation of a delay-locked loop (DLL) circuit.

Semiconductor memory devices are being continuously developed to increase their degree of integration and operating speed. Synchronous memory devices have been developed to operate in synchronization with a clock signal applied from outside a memory chip of the synchronous memory devices so that the operating speed is enhanced.

In a synchronous memory device, when data is synchronized with an external clock signal and is output, a data valid window is reduced, thus causing errors when the synchronous memory device is operated at a high frequency. Thus, a DLL circuit is used to delay the external clock signal during a predetermined period to allow the data to be exactly synchronized with the rising edge and the falling edge of the clock signal and to be output. That is, the DLL circuit generates an internal clock signal for compensating delay components in a dynamic random access memory (DRAM), and this clock generating procedure is referred to as a 'locking operation'.

SUMMARY

In accordance with an exemplary embodiment of the present invention a semiconductor memory device for controlling an operation of a DLL circuit is provided that can enlarge a data valid window and can reduce power consumption.

In accordance with an exemplary embodiment of the present invention a semiconductor memory device is provided having a delay-locked loop circuit that receives an external clock signal and that performs a locking operation on the external clock signal and on an internal clock signal output from the delay-locked loop circuit to obtain a locked state. A control unit controls the delay-locked loop circuit to constantly maintain the locked state during an updating period of an auto-refresh period of an auto-refresh operation for refreshing memory banks, the auto-refresh period having both the updating period and a noise period.

The updating period of the auto-refresh period may be a period in which all of the memory banks do not perform the auto-refresh operation.

The control unit, in response to an auto-refresh request signal that indicates the auto-refresh period and an auto-refresh end signal that indicates that the noise period has ended, may output a control signal to the delay-locked loop circuit to control a locking operation of the delay-locked loop circuit.

The control unit may include an AND gate that performs a logical AND operation on the auto-refresh request signal and the auto-refresh end signal and outputs the control signal as a result of the logical AND operation.

The memory banks may be grouped into memory bank groups. When the semiconductor memory device performs the auto-refresh operation on each of the memory bank groups, the AND gate may perform a logical AND operation on memory bank group end signals for respectively indicating that the memory banks in each of the memory bank groups have ended the auto-refresh operation and to output the auto-refresh end signal.

The auto-refresh operation may be performed in the noise period.

According to an exemplary embodiment of the present invention, a control unit is provided for controlling a delay-locked loop coupled to memory banks. An AND gate performs a logical AND operation on a memory bank auto-refresh request signal and on a memory bank end signal that indicates that a memory bank has ended the auto-refresh operation, and outputs the auto-refresh end signal for controlling a locking operation of the delay-locked loop.

According to an exemplary embodiment of the present invention a method of operating a delay-locked loop during an auto-refresh period of an auto-refresh operation that refreshes memory banks, the auto-refresh operation being performed during an auto-refresh period having a noise period and an updating period, is provided. A determination is made as to when during the auto-refresh period an auto-refresh request is enabled and an auto-refresh ends. A delay-locked loop control signal is generated when both the auto-refresh request is enabled and the auto-refresh ends. The delay-locked loop control signal is applied to the delay-locked loop during the updating period to maintain a locked state of a locking operation of the delay-locked loop.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EXEMPLARY EMBODIMENTS

Figure 1:
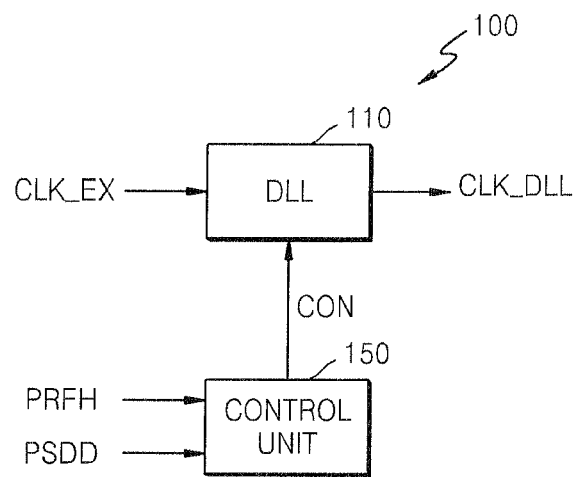
FIG. 1 is a block diagram of a semiconductor memory device according to an exemplary embodiment of the present invention.

Hereinafter, exemplary embodiments of present invention will be described in detail with reference to the attached drawings. Like reference numerals in the drawings denote like elements.

FIG. 1 is a block diagram of a semiconductor memory device 100. The semiconductor memory device 100 includes a DLL circuit 110 and a control unit 150.

A DLL circuit typically includes a phase detector, a charge pump, a variable delay line, and a delay compensation circuit. The phase detector receives an external clock signal and the internal clock signal, and detects the phase difference between the external clock signal and the internal clock signal. The phase detector generates an up-signal or a down-signal based on the detected phase difference. The charge pump generates a delay control signal in response to the up-signal, and the down-signal. The variable delay line generates the internal clock signal, which is synchronized with the external clock signal, in response to the external clock signal, the delay control signal from the charge pump and any externally applied control signal. The delay compensation circuit compensates for a phase delay of the internal clock signal and provides the phase detector with a feedback signal corresponding to an amount of the compensation of the phase delay.

As seen in FIG. 1, an external clock signal CLK_EX is applied to the DLL circuit 110, and the DLL circuit 110 generates an internal clock signal CLK_DLL for compensating for clock delay components generated while the external clock signal CLK_EX is transmitted to a data output terminal. The internal clock signal generating procedure is referred to as a 'locking operation'.

In general, when the semiconductor memory device 100 operates, a power voltage or a ground voltage varies so that, although the DLL circuit 110 has locked the external clock signal CLK_EX by using the internal clock signal CLK_DLL, the DLL circuit 110 cannot constantly maintain the locked state. Thus, the control unit 150 controls the DLL circuit 110 to constantly maintain the locked state after performing the locking operation.

Hereinafter, the operation of the DLL circuit 110 so as to constantly maintain the locked state is referred to as an 'updating operation'. The control unit 150 controls the DLL circuit 110 to perform the updating operation during an updating period in an auto-refresh period, the updating period constituting a period excluding a noise period. The auto-refresh period constitutes a period in which an auto-refresh operation is performed to refresh memory banks. The auto-refresh period is generally set to be longer than the period in which the auto-refresh operation is performed so that a margin is obtained. That is, the auto-refresh period is divided into the noise period and the updating period. The noise period is a period in which noise is generated due to variation in the power voltage or the ground voltage when all of a plurality of memory banks perform the auto-refresh operation. The updating period is a period in which all the memory banks have ended the auto-refresh operation, meaning that the auto-refresh operation is not performed in the updating period. However, the updating period is considered part of the auto-refresh period. In the updating period, the power voltage or the ground voltage is not varied but is maintained in a stable state.

The control unit 150 outputs a control signal CON to the DLL circuit 110 in response to an auto-refresh request signal PRFH and an auto-refresh end signal PSDD. The function of the auto-refresh request signal PRFH is to indicate the auto-refresh period, and the function of the auto-refresh end signal PSDD is to indicate that all the memory banks have ended the auto-refresh operation. The DLL circuit 110 performs the updating operation in response to the control signal CON.

Figure 2:
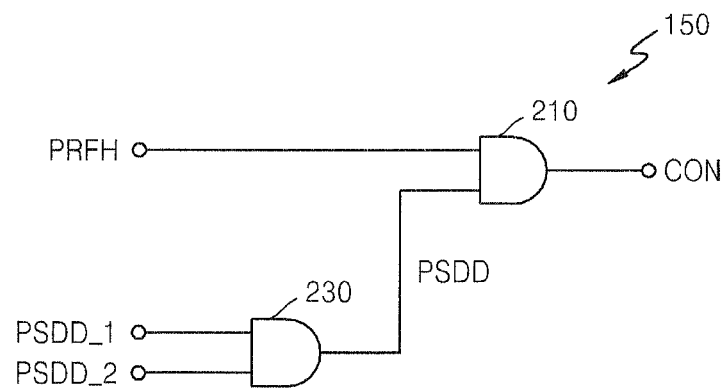
FIG. 2 is a diagram of a control unit of the semiconductor memory device of FIG. 1.

FIG. 2 is a circuit diagram of the control unit 150 in FIG. 1, according to an exemplary embodiment of the present invention.

Referring to both FIGS. 1 and 2, the control unit 150 includes a first AND gate 210. The auto-refresh request signal PRFH and the auto-refresh end signal PSDD are input to the first AND gate 210, and the first AND gate 210 performs a logical AND operation on the auto-refresh request signal PRFH and the auto-refresh end signal PSDD, and thus outputs a control signal CON. That is, the control signal CON is a signal enabled in the updating period that is a period in which all the memory banks have ended the auto-refresh operation.

The control unit 150 further includes a second AND gate 230 for the case in which the semiconductor memory device 100 performs the auto-refresh operation on each of a plurality of memory bank groups respectively including a plurality of memory banks. For example, it is assumed that, when the semiconductor memory device 100 applies the internal CLK_DLL to each of a plurality of first through eighth memory banks, the first through fourth memory banks are included in a first memory bank group, the fifth through eighth memory banks are included in a second memory bank group, and the first memory bank group and the second memory bank group simultaneously perform the auto-refresh operation. Also, it is assumed that, when the first memory bank group performs the auto-refresh operation, the auto-refresh operation is performed in an order of the first memory bank, the second memory bank, the third memory bank, and the fourth memory bank; and when the second memory bank group performs the auto-refresh operation, the auto-refresh operation is performed in an order of the fifth memory bank, the sixth memory bank, the seventh memory bank, and the eighth memory bank.

In this case, the first memory bank group and the second memory bank group respectively output a memory bank group end signal PSDD_1 and a memory bank group end signal PSDD_2, wherein the function of each of the memory bank group end signal PSDD_1 and the memory bank group end signal PSDD_2 is to indicate that the auto-refresh operation is ended. That is, when the first through fourth memory banks sequentially complete the auto-refresh operation, the memory bank group end signal PSDD_1 is enabled, and when the fifth through eighth memory banks complete the auto-refresh operation, the memory bank group end signal PSDD_2 is enabled. The second AND gate 230 performs a logical AND operation on the memory bank group end signal PSDD_1 and the memory bank group end signal PSDD_2, thereby outputting the auto-refresh end signal PSDD. That is, the auto-refresh end signal PSDD may be defined as a signal for indicating that all memory banks included in the first and second memory bank groups have ended the auto-refresh operation.

Figure 3:
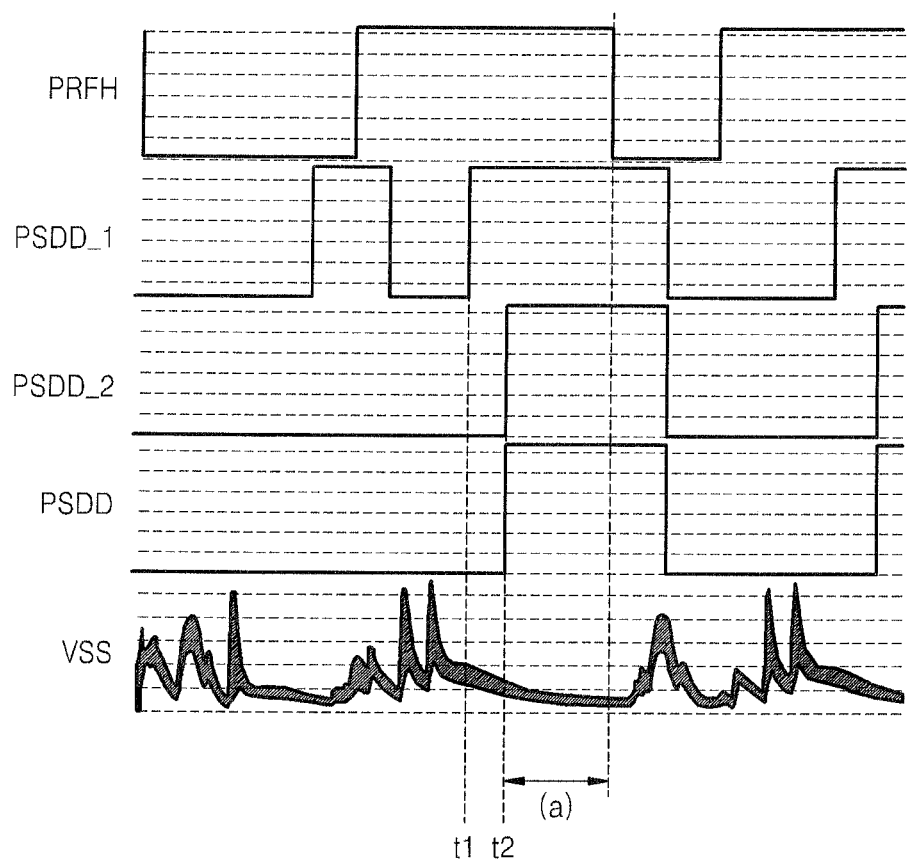
FIG. 3 is a diagram of waveforms of signals of the semiconductor memory device.

FIG. 3 is a diagram of waveforms of signals of the semiconductor memory device 100, according to an exemplary embodiment of the present invention.

The updating operation performed by the semiconductor memory device 100 will now be described with reference to FIGS. 1 through 3. The auto-refresh period constitutes a period in a first logic state when an auto-refresh request signal PRFH is enabled. Hereinafter, the first logic state is defined as a logic high state. In the period in which the auto-refresh request signal PRFH is in the first logic state, a period in which a memory bank group end signal PSDD_1, a memory bank group end signal PSDD_2, and an auto-refresh end signal PSDD are in a second logic state constitutes a period in which the auto-refresh operation is performed; and a period in which the memory bank group end signal PSDD_1, the memory bank group end signal PSDD_2, and the auto-refresh end signal PSDD are in the first logic state constitutes a period in which the auto-refresh operation is not performed. Hereinafter, the second logic state is defined as a logic low state.

When the auto-refresh operation is not performed by each of the plurality of memory bank groups, the control signal CON is enabled, that is, the control signal CON is in the first logic state in a period (a) in which the auto-refresh request signal PRFH and the auto-refresh end signal PSDD are in the first logic state. Thus, the DLL circuit 110 performs the updating operation in the period (a).

When the auto-refresh operation is performed by each of the plurality of memory bank groups, the memory bank group end signal PSDD_1 is transited from the second logic state to the first logic state at a time t1, and the memory bank group end signal PSDD_2 is transited from the second logic state to the first logic state at a time t2. That is, the fourth memory bank of the first memory bank group ends the auto-refresh operation at the time t1, and the eighth memory bank of the second memory bank group ends the auto-refresh operation at the time t2. Thus, the auto-refresh end signal PSDD transits to the first logic state at the time t2. Accordingly, the control signal CON is in the first logic state in the period (a) in which the auto-refresh request signal PRFH and the auto-refresh end signal PSDD are in the first logic state. Thus, the DLL circuit 110 performs the updating operation in the period (a).

While all the memory banks perform the auto-refresh operation, a sensing operation is performed so that a large amount of current flows to the memory banks, and as a result, a ground voltage VSS is significantly varied, thereby generating noise. However, in the updating period in which all the memory banks do not perform the auto-refresh operation, in other words, in the period (a) of the auto-refresh period, the ground voltage VSS is almost unchanged and thus is maintained in a stable state. FIG. 3 illustrates the ground voltage VSS but in the case of a power voltage, the power voltage is varied in the noise period and is almost unchanged in the updating period and thus is maintained in a stable state, in the same manner as the case of the ground voltage VSS.

While exemplary embodiments of the present invention have been particularly shown and described, it will be understood that various changes in form and details may be made therein without departing from the spirit and scope of the following claims.

What is claimed is:

1. A semiconductor memory device, comprising:
   a delay-locked loop circuit that receives an external clock signal and that generates an internal clock signal through a locking operation; and
   a control unit that controls the delay-locked loop circuit to maintain a locked state during a first period of a refresh period for refreshing memory cells,
   wherein the refresh period comprises both the first period and a second period.

2. The semiconductor memory device of claim 1, wherein the first period is a period in which a refresh operation is not performed regarding the memory cells.

3. The semiconductor memory device of claim 1, wherein the second period is a period in which a refresh operation is performed regarding the memory cells.

4. The semiconductor memory device of claim 1, wherein a power voltage variation or a ground voltage variation in the first period is smaller than in the second period.

5. The semiconductor memory device of claim 1, wherein the control unit is configured to control the delay-locked loop circuit in response to a first signal that indicates the refresh period and a second signal that indicates a refresh operation has ended.

6. The semiconductor memory device of claim 1, wherein refreshing for the memory cells is an auto-refresh operation.

7. A semiconductor memory device, comprising:
   a control unit configured to output a control signal in response to a first signal and a second signal
   a delay-locked loop circuit configured to perform an updating operation for maintaining a locked state during a partial period of a refresh period for refreshing memory cells in response to the control signal,
   wherein the first signal indicates the refresh period and the second signal indicates a refresh operation has ended.

8. The semiconductor memory device of claim 7, wherein the partial period is a period in which the first signal and the second signal are enabled.

9. The semiconductor memory device of claim 7, wherein the second signal is enabled when a refresh operation is not performed regarding the memory cells.

10. The semiconductor memory device of claim 7, wherein the memory cells are grouped into memory banks, and the second signal comprises a first end signal and a second end signal that indicate end of a refresh operation for corresponding memory banks respectively, and the control unit is further configured to output a control signal in response to the first end signal and the second end signal.

11. The semiconductor memory device of claim 10, wherein control unit comprises;
   a first logic element for performing a logical operation on the first end signal and the second end signal; and
   a second logic element for performing a logical operation on the first signal and the output of the first logic element and outputting the control signal.

12. A method of operating a delay-locked loop during a refresh period for refreshing memory cells, the refresh period having a first period and a second period, the method comprising:
   determining the first period according to whether a first signal and a second signal are enabled;
   generating a control signal during the first period; and
   applying the control signal to the delay-locked loop during the first period to maintain a locked state of the delay-locked loop.

13. The method of claim 12, wherein the first signal indicates the refresh period and the second signal indicates a refresh operation has ended.

14. The method of claim 12, wherein the memory cells are grouped into memory banks, and the second signal comprises a first end signal and a second end signal that indicate end of the refresh operation for corresponding memory bank respectively, and determining the first period according to whether the first signal and the first end signal and the second end signal are enabled.

15. The method of claim 12, wherein a power voltage variation or a ground voltage variation in the first period is smaller than in the second period.

16. A method of operating a delay-locked loop during a refresh period for refreshing memory cells, the refresh period having a updating period and a noise period, the method comprising:
   determining the updating period according to whether both a first signal and a second signal are enabled:
   determining the noise period whether either the first signal or the second signal disabled;
   generating a control signal during the updating period; and
   applying the control signal to the delay-locked loop during the updating period to maintain a locked state of the delay-locked loop.

* * * * *